United States Patent
Lai et al.

(10) Patent No.: US 8,598,033 B1
(45) Date of Patent: Dec. 3, 2013

(54) METHOD FOR FORMING A SALICIDE LAYER

(71) Applicant: United Microelectronics Corp., Hsin-Chu (TW)

(72) Inventors: Kuo-Chih Lai, Tainan (TW); Chia Chang Hsu, Kaohsiung (TW); Bor-Shyang Liao, Kaohsiung (TW); Chun-Ling Lin, Tainan (TW); Shu Min Huang, Tainan (TW); Min-Chung Cheng, Chiayi County (TW); Chi-Mao Hsu, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/646,726

(22) Filed: Oct. 7, 2012

(51) Int. Cl.
*H01L 21/4763* (2006.01)

(52) U.S. Cl.
USPC .......................................... 438/649

(58) Field of Classification Search
USPC .................................................. 438/649, 682
See application file for complete search history.

(56) References Cited

U.S. PATENT DOCUMENTS

| | | | |
|---|---|---|---|
| 5,950,090 A | 9/1999 | Chen | |
| 5,998,873 A | 12/1999 | Blair | |
| 6,333,262 B1* | 12/2001 | Tseng et al. | 438/664 |
| 7,214,620 B2 | 5/2007 | Kim | |
| 2002/0036353 A1* | 3/2002 | Song et al. | 257/774 |
| 2004/0266182 A1 | 12/2004 | Ku | |
| 2009/0278170 A1* | 11/2009 | Yang et al. | 257/190 |
| 2010/0040768 A1 | 2/2010 | Dhindsa | |
| 2013/0078800 A1* | 3/2013 | Lai et al. | 438/653 |

* cited by examiner

*Primary Examiner* — Bradley K Smith
(74) *Attorney, Agent, or Firm* — Winston Hsu; Scott Margo

(57) ABSTRACT

The present invention provides a method for forming a salicide layer. First, a metal-atom-containing layer is formed on a substrate, a first rapid thermal process (RTP) is then performed to the metal-atom-containing layer to form a transitional salicide layer on a specific region. The metal-atom-containing layer is then removed, a thermal conductive layer is formed on the surface of the transitional salicide layer, and a second RTP is performed on the transitional salicide layer.

13 Claims, 5 Drawing Sheets

METHOD FOR FORMING A SALICIDE LAYER

BACKGROUND OF THE INVENTION

1. Field of the Invention

The present invention relates to a manufacturing method for a semiconductor device, and more particularly, to a method for forming a salicide layer.

2. Description of the Prior Art

Metal-oxide-semiconductors (MOS) are devices widely used in semiconductor integrated circuits. The quality of a MOS is particularly affected by the performances of the source and the drain. The gate usually comprises a polysilicon layer as a main conductive layer, and the source/drain region is formed on the silicon substrate by an implant process, a (self-aligned silicide) salicide layer is then formed on the polysilicon layer through a thermal process in order to decrease the sheet resistance of the gate and improve the operating speed of the MOS.

It is worth noting that a salicide layer requires two rapid thermal processes (RTP) in the conventional process. First, a metal layer is formed on a surface of a silicon substrate, and a first RTP process is performed, which allows the metal layer to react with the silicon substrate and to form a transitional salicide layer with smaller grains but higher resistance. Afterwards, the metal layer is removed. At this time, there is only a transitional salicide layer disposed on the silicon substrate and a second RTP process is then performed to transform the salicide layer in order to reduce its resistance. It is worth noting that the salicide layer formed on the silicon substrate has a non-uniform surface profile issue, especially within a low-density salicide patterned region, which influences the formation of the salicide layer.

SUMMARY OF THE INVENTION

The present invention provides a method for forming a salicide layer. First, a metal-atom-containing layer is formed on a substrate, a first rapid thermal process (RTP) is then performed on the metal-atom-containing layer to form a transitional salicide layer on a specific region, afterwards, the metal-containing atomic layer is removed, a thermal conductive layer is formed on the surface of the transitional salicide layer, and a second RTP is performed on the transitional salicide layer.

The feature of the present invention is that after the cap layer and the metal-atom-containing layer are removed, and before the second RTP is performed, a thermal conductive layer is formed on the exposed transitional salicide layer. Thanks to the thermal conductive layer, the heat provided by the second RTP can completely and uniformly diffuse to each transitional salicide layers, unlike in conventional processes, so that the second RTP required temperature can be set lower, while improving the quality of the salicide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
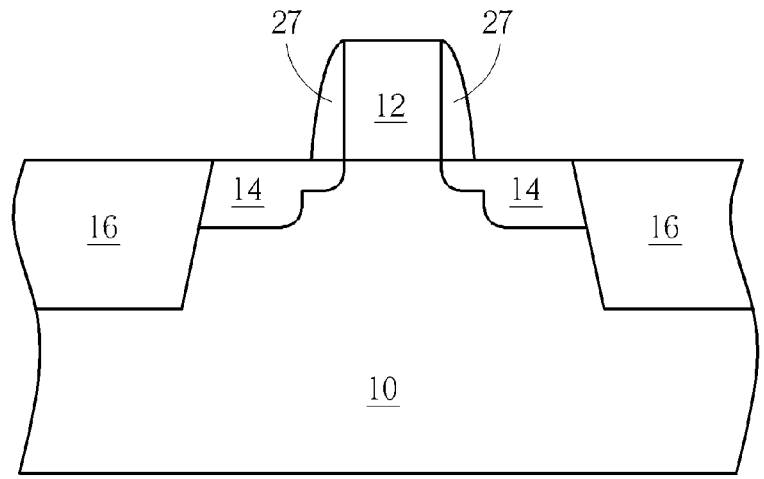
FIGS. 1-6 are schematic diagrams illustrating a manufacturing method of the salicide layer according to a first preferred embodiment of the present invention.

Please refer to FIGS. 1-6. FIGS. 1-6 are schematic diagrams illustrating a manufacturing method of a salicide layer according to a first preferred embodiment of the present invention. The manufacturing method of the salicide layer in this embodiment includes the following steps: first, as shown in FIG. 1, a substrate 10 is provided, such as a silicon substrate, an epitaxial silicon substrate, a silicon germanium substrate or a silicon carbide substrate. The first preferred embodiment of the present invention uses bulk silicon as a substrate, but is not limited to. A gate structure 12 and a source/drain region (S/D region) 14 disposed on the substrate 10, a shallow trench isolation (STI) 16 is disposed in the substrate 10 and surrounding the gate structure 12 and the source/drain region 14. The gate structure 12 includes a metal gate or a polysilicon gate. In this embodiment, the gate structure 12, for example, is a polysilicon gate; hence a salicide layer formed in following steps may be disposed on the source/drain region 14 and on the top of the gate structure 12. Besides, this embodiment further comprises a dielectric layer (not shown) formed between the gate structure 12 and the substrate 10, and a spacer 27 covering the sidewalls of the gate structure 12. In the present invention, STI 16 are formed by etching a plurality of trenches in the substrate 10, wherein an insulating material is formed in these trenches. A light doped drain (LDD) and the S/D region 14 are formed by an implant process on the exposed structure 10 (where it is not covered by the gate structure 12). Those methods to form each components are well-know to persons of ordinary skills in the art and the details will not be described here.

Figure 2:
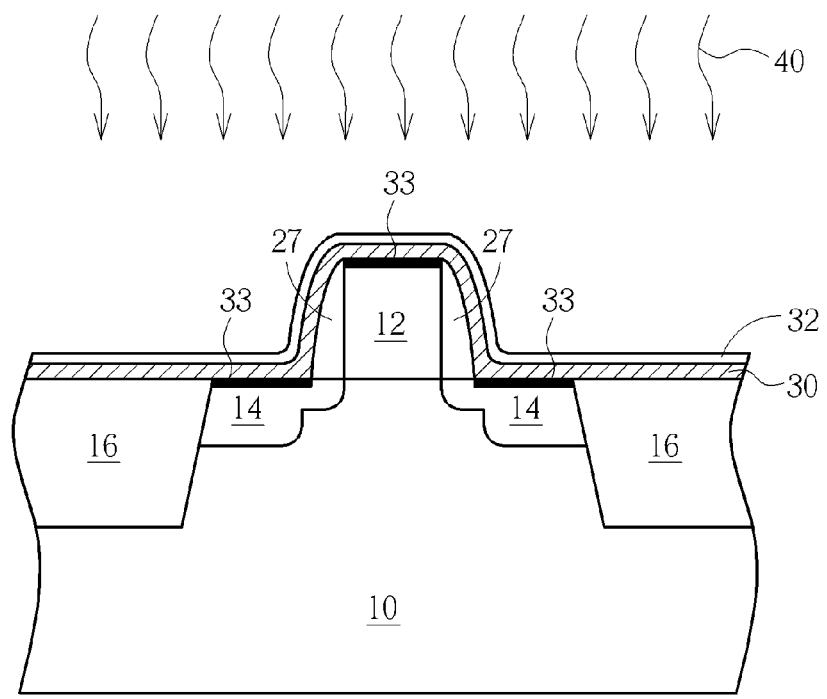

As shown in FIG. 2, a self-aligned silicide (salicide) process is performed. For example, a metal-atom-containing layer 30 is entirely formed on the substrate 10, covering the gate structure 12, the S/D region 14, the STI 16 and others region on the substrate 10 surface. The metal-atom-containing layer 30 may comprise a metal layer, a metal alloy layer or a metal-compounds layer. In this embodiment, the metal-atom-containing layer 30 is a nickel-platinum alloy (Ni/Pt) layer, but not limited thereto. The metal-atom-containing layer 30 may also include others materials that can reacts with silicon atom, such as cobalt (Co) or titanium (Ti). Afterwards, a first rapid thermal process (RTP) 40 is carried out on the metal-atom-containing layer 30, wherein the temperature of the first RTP 40 is preferably between 200~300° C., which allows the metal-atom-containing layer 30 to react with the silicon-containing surface, on the top of the gate structure 12 and the S/D region 14, so as to form a transitional salicide layer 33. The material of the silicon containing surface may comprise single-crystal silicon, epitaxial silicon, silicon germanium (SiGe), silicon carbon (SiC) or silicon phosphorus (SiP). The main material of the transitional salicide layer 33 can be $Ni_2Si$, but is not limited thereto. It is worth noting that the surface reacts with the metal-atom-containing layer 30 containing silicon atoms, so the transitional salicide layer 33 can only be formed on the surface of the substrate 10, on the top surface of the gate structure 12 (when the gate structure 12 is a silicon-containing gate which is not covered by a dielectric hard mask), on the surface of the S/D region 14 or other substrate surface that is not covered by a silicide block. In another embodiment of the present invention, the gate structure 12 is a stacked structure wherein a dielectric hard mask is disposed on the silicon-containing gate; hence the salicide layer will not be formed on the gate structure after the salicide process is performed. That embodiment is not shown in the figures, but the manufacturing process is similar to the process shown in FIGS. 1~6. The only difference between those two embodiments resides in the fact that the salicide layer is formed on the gate structure 12 or not. Besides, a cap layer 32 can selectively be formed on the metal-atom-containing layer 30 before the first RTP 40 is performed, to prevent the metal-atom-containing layer 30 from directly contacting the air and be destroyed. In addition, the cap layer 32 helps to keep the heat in the transitional salicide layer 33 during the first RTP 40. In this embodiment, the material of the cap layer 32 includes titanium nitride (TiN), tantalum nitride (TaN) or tungsten nitride (WN), but not limited thereto, it may also be formed with other materials in accordance with the actual production. The metal-atom-containing layer 30 and the cap layer 32 are preferably formed in-situly or without breaking vacuum. For example, those two layers are formed in a same chamber or are formed in a same cluster tool but in different chambers.

Figure 3:
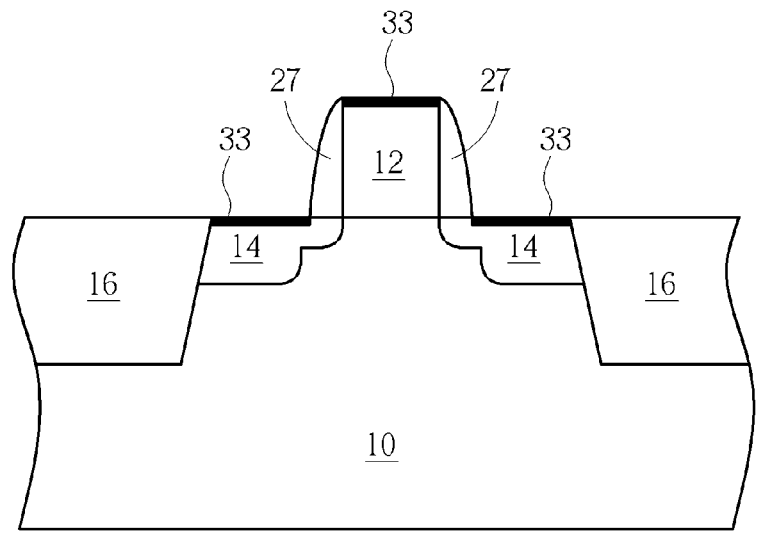
Figure 4:
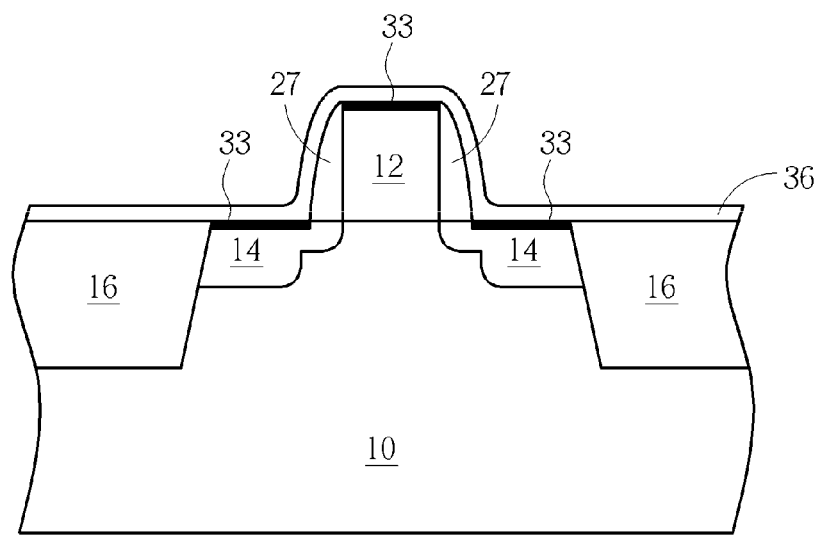
Figure 5:
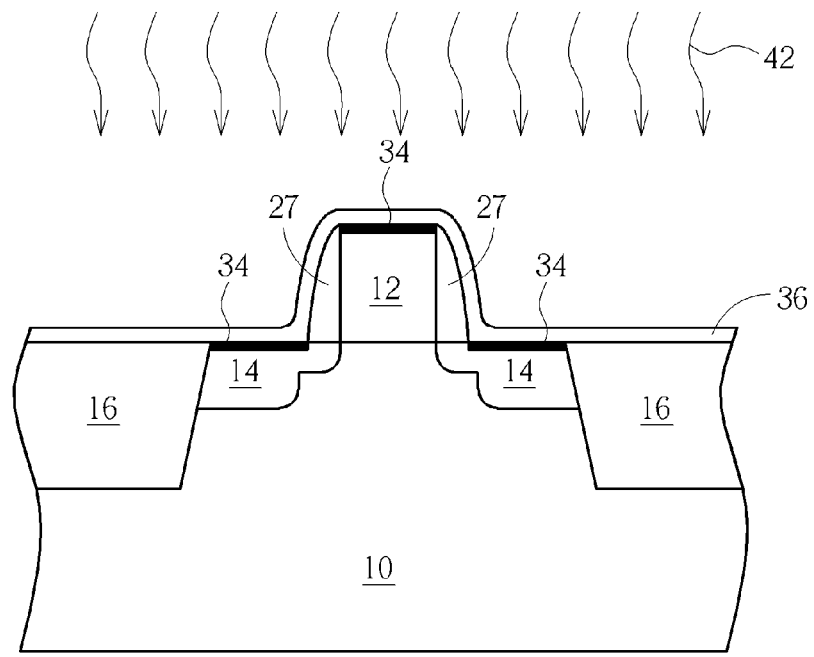

As shown in FIG. 3, the cap layer 32 is removed and the rest of the metal-atom-containing layer 30 entirely exposes the transitional salicide layer 33 disposed on the S/D region 14, on the top of the gate structure 12 and on the surface of the substrate 10. A cleaning process is selectively performed. Afterwards, as shown in FIG. 4, a thermal conductive layer 36 is entirely formed on the surface of the substrate 10, covering the transitional salicide layer 33 disposed on the gate structure 12, on the S/D region 14, on the STI 16 and on other surface regions of the substrate 10. As shown in FIG. 5, a second RTP 42 is performed on the transitional salicide layer 33. The second RTP 42 uses a higher temperature to modify the phase of the transitional salicide layer 33 to become a salicide layer 34 with lower resistance. In this embodiment, the salicide phase state from the $Ni_2Si$ is modified into NiSi, wherein the NiSi is a monosilicide with low Rs values, but not limited thereto.

In this embodiment, the temperature of the second RTP 42 is between 350~700° C. The material of the thermal conductive layer 36 may includes titanium nitride (TiN), tantalum nitride (TaN), tungsten nitride (WN), some metal-containing materials, or others nonmetallic material with good thermal conductivity, to help the heat to be uniformly and completely transmitted to the transitional salicide layer 33, thereby improving the quality of the salicide layer 34.

It's worth noting that, in conventional salicide processes, due to the different layouts, the density of salicide formed on the semiconductor wafer layout pattern is not homogenous. In general, a high-density region which comprises more salicide has a distribution ratio of a metal silicide to a non-metallic silicide (silicon-oxygen compound or silicon-nitrogen compound) higher than in a low-density region, and the thermal conductivity of the metal silicide is different from that of the non-metallic silicide. Hence after the second RTP, the silicide layer formed on the surface of the substrate has the problem of an non-uniform surface, especially in the low-density salicide regions, which seriously affects the quality of the salicide: even if the temperature of the second RTP is higher than 700° C., the phase transition of the transitional salicide layer will not be complete. In another way, the thermal conductive layer 36 is formed on the transitional salicide layer 33; so that even if the temperature of the second RTP 42 does not exceed 700° C., the heat can be completely and uniformly transmitted to the transitional salicide layer 33, thereby improving the quality of the salicide layer 34.

The material of the thermal conductive layer 36 may be similar to or different from the material of the cap layer 32. In order to remove the thermal conductive layer 36 from the surface of the salicide layer 34 in the following step, the material of the thermal conductive layer 36 is preferably chosen among materials having high etching selectivity with respect to the salicide layer 34 under the same etching recipe. In addition, the material of the thermal conductive layer 36 is chosen to not react with the silicon atoms, or only when the reaction temperature is higher than 700° C., so as to prevent the thermal conductive layer 36 to react with the silicon atom during the second RTP 42, which would influence the formation of the salicide layer 34.

Figure 6:
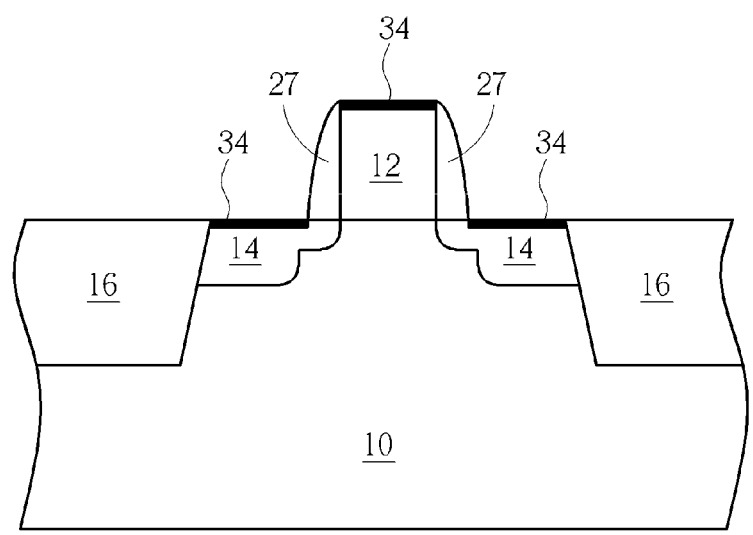

Finally, as shown in FIG. 6, the thermal conductive layer 36 is removed, and a cleaning process can selectively be performed, thereby completing the formation of the salicide layer 34 of the present invention. The feature of the present invention is that before the second RTP 42 is performed, the thermal conductive layer 36 is formed on the exposed transitional salicide layer 33; afterwards, the second RTP 42 is then performed. Thanks to the thermal conductive layer 36, the heat provided by the second RTP 42 can be completely and uniformly transmitted to each transitional salicide layer 33, thereby improving the quality of the salicide layer 34.

Figure 7:
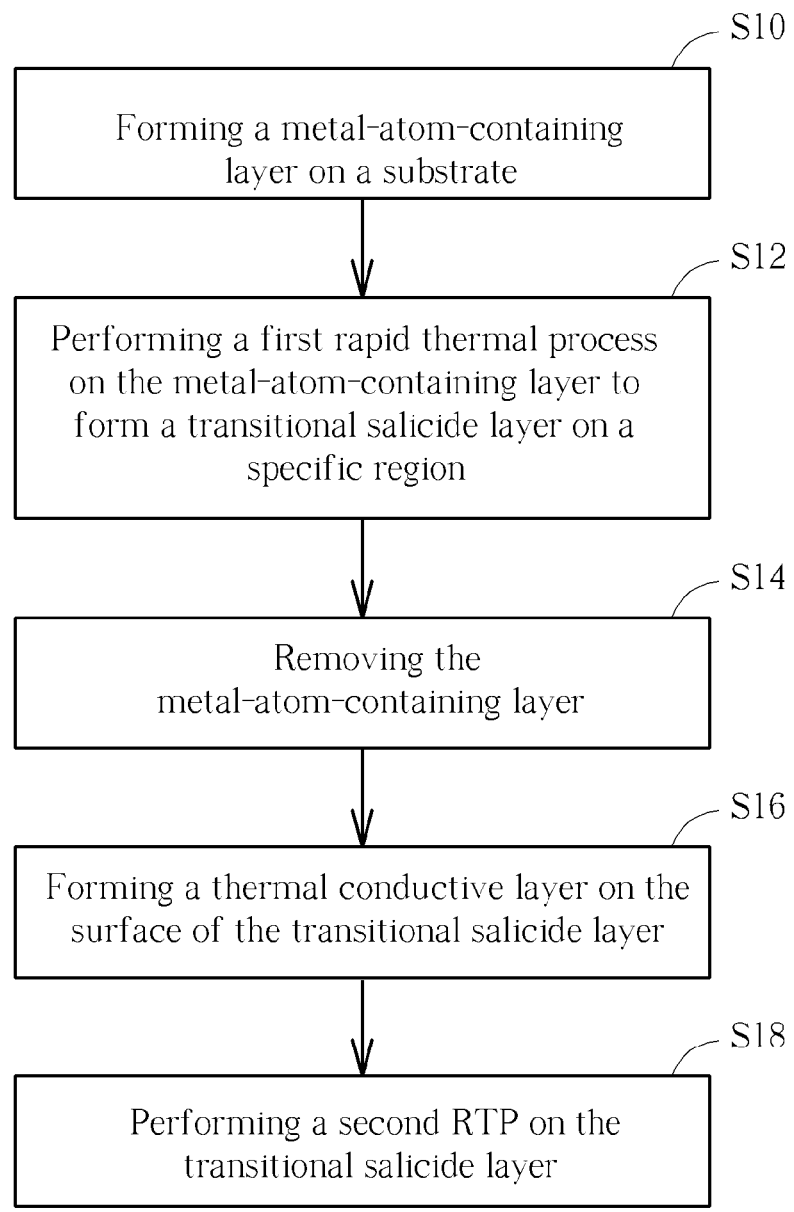
FIG. 7 illustrates the process flow diagram in accordance with the first preferred embodiment of the present invention.

FIG. 7 illustrates the process flow diagram in accordance with the first preferred embodiment of the present invention. As shown in FIG. 7, the present invention at least comprises the following steps, including: step S10: forming a metal-atom-containing layer on a substrate; step S12: performing a first rapid thermal process (RTP) on the metal-atom-containing layer to form a transitional salicide layer on a specific region; step S14: removing the metal-atom-containing layer; step S16: forming a thermal conductive layer on the surface of the transitional salicide layer; and step S18: performing a second RTP on the transitional salicide layer. Besides, between the step S10 and S12, an additional step can be further selectively added: forming a cap layer on the metal-atom-containing layer. After the step S18, the thermal conductive layer can selectively be removed.

Figure 8:
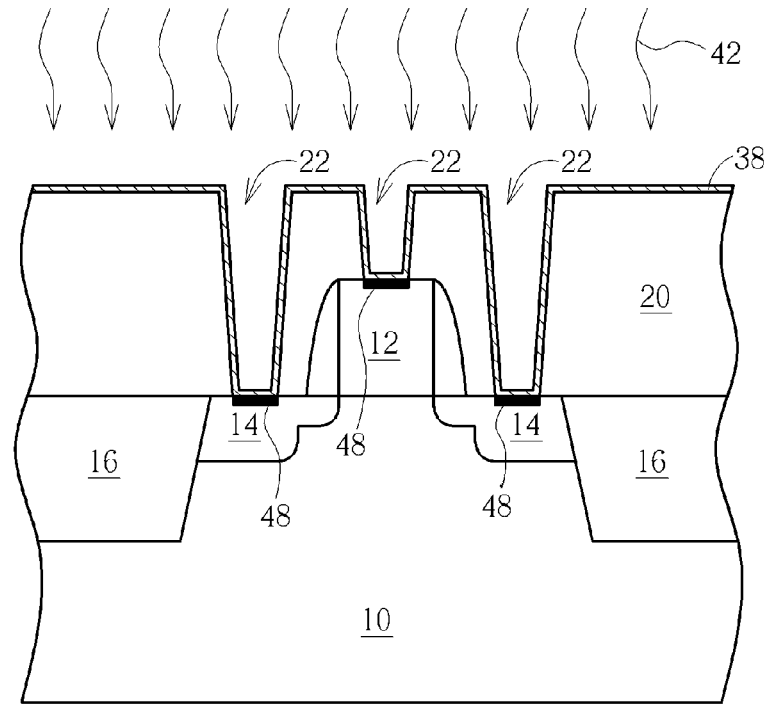
FIGS. 8-9 are schematic diagrams illustrating a manufacturing method of the salicide layer according to a second preferred embodiment of the present invention.
Figure 9:
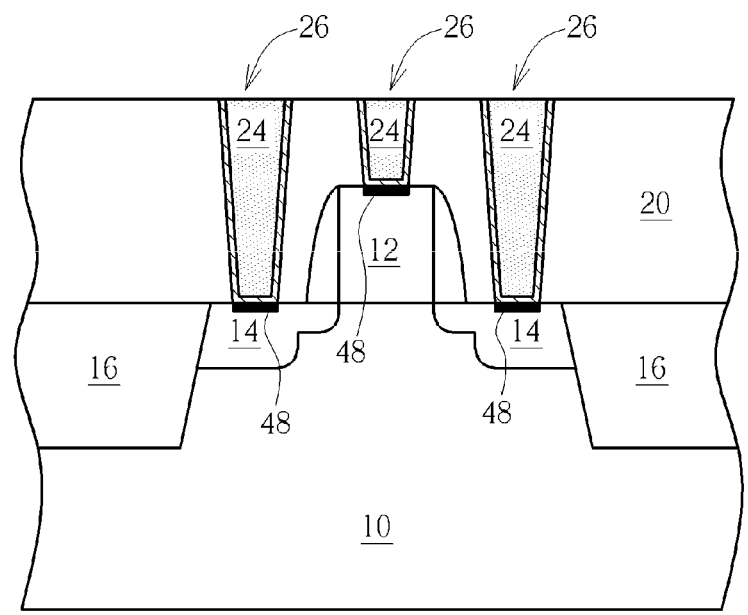

It is worth noting that, the present invention can be combined with post contact plug processes. FIGS. 8-9 are schematic diagrams illustrating a manufacturing method of the salicide layer according to a second preferred embodiment of the present invention. As shown in FIG. 8, a transistor is formed on the substrate 10, wherein the transistor comprises the gate structure 12, the S/D region 14 and the STI 16. Afterwards, a dielectric layer 20 is formed to cover the transistor, and a plurality of contact holes 22 are formed in the dielectric layer 20 through an etching process to expose the top of the gate structure 12 and the S/D region 14. A salicide process is then performed in each contact hole 22. The method for forming the salicide is similar to the method described in the first preferred embodiment, including forming a metal-atom-containing layer (not shown) and a cap layer (not shown) in the contact holes, and performing a first rapid thermal process (RTP) to form a transitional salicide layer (not shown) between the contact hole 22 and the metal-atom-containing layer. After removing the rest of the metal-atom-containing layer and the cap layer that did not react with the silicon substrate, a thermal conductive layer 38 is formed in the contact hole 22, and a second RTP 42 is then performed to modify the transitional salicide layer into a salicide layer 48 in each contact holes 22. The dielectric layer 20 can be a composition of a single dielectric layer and a multiple dielectric layer, such as SiC doped with nitrogen or oxygen or undoped SiC, silicon nitride, un-doped silicate glass (USG) or phosphor silicate glass (PSG), silicon oxide which using tetraethyl-ortho-silicate (TEOS) as the precursor, low-k or ultra low-k dielectric material, or a combination thereof. The difference between this embodiment and the first preferred embodiment is that the salicide layer is only formed in each contact hole 22. The other components, material properties, and manufacturing method of the embodiment are similar to the first preferred embodiment detailed above and will not be redundantly described.

After the salicide layer 48 mentioned above is completed, as shown in FIG. 9, a contact structure may be formed on the salicide layer 48 to electrically contact other components. For example, a barrier layer (not shown) and a conductive layer 24 are filled in each contact hole 22, and a planarization process, such as a chemical mechanical polishing (CMP) is then performed to remove the rest of the thermal conductive layer 38 and the conductive layer 24 disposed on the dielectric layer 20, and a plurality of contact structures 26 are completed. It is worth noting that, in this embodiment, the thermal conductive layer 38 may be kept in the contact hole 22 in some situations. In other words, after the second RTP 42, the thermal conductive layer 38 can selectively be not removed. At this time, the thermal conductive layer 38 is used as the barrier layer of the contact structure 26. For example, tungsten (W) is generally be used as the conductive layer filled in the contact holes. When the material of the thermal conductive layer is titanium/titanium nitride (Ti/TiN), the thermal conductive layer 38 can be kept in the contact holes 22, disposed on the salicide layer 48 used as the barrier layer. The barrier layer prevents the conductive layer filled in the contact hole 22 from diffusing to the substrate 10, and the tungsten can be directly formed in the contact hole. The contact structure (not shown) can also be formed on the salicide layer like in the first preferred embodiment; the salicide layer can effectively reduce the sheet resistance between the contact structure and the gate structure or the source/drain region. But since the thermal conductive layer 36 is entirely disposed on the transistor, if the thermal conductive layer 36 is an electrically conductive material, the contact structure should be formed after the thermal conductive layer 36 is removed, to prevent the contact structures from connecting to each other and shorting through the thermal conductive layer 36. But if the thermal conductive layer 36 is a non-electrically conductive material, it can be selectively kept and not removed.

In those embodiments mentioned above, the gate structure is a polysilicon gate, but the present invention is not limited thereto, the gate structure may be a metal gate. In this case, the salicide layer won't be formed on the top of the gate structure. Additionally, the metal gate structure of the present invention could be integrated with a high-k first gate last process, a high-k last gate last process or a gate first process and other metal gate processes, further comprising a high dielectric constant (high-k) material layer, which could be selected from the group of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide $(SrTiO)_3$, zirconium silicon oxide ($ZrSiO_4$), hafnium zirconium oxide ($HfZrO_4$), strontium bismuth tantalite ($SrBi_2Ta_2O_9$, SBT), lead zirconate titanate, ($PbZr_xTi_{1-x}O_3$, PZT) and barium strontium titanate ($Ba_xSr_{1-x}TiO_3$, BST). Besides, the contact holes may be formed only on the S/D region but not formed on the metal gate, so that the metal-atom-containing layer, the cap layer and the thermal conductive layer will not contact the metal gate during the salicide process.

To summarize the above descriptions, the feature of the present invention is that after a cap layer and a metal-atom-containing layer are removed, and before a second RTP is performed, a thermal conductive layer is formed on the exposed transitional salicide layer. Thanks to the thermal conductive layer, the heat provided by the second RTP can completely and uniformly be transmitted to each transitional salicide layer. Compared with conventional processes, the second RTP required temperature can be set lower, which improves the quality of the salicide layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a salicide layer, comprising:
forming a metal-atom-containing layer on a substrate;
performing a first rapid thermal process (RTP) on the metal-atom-containing layer to form a transitional salicide layer on a specific region;
removing the metal-atom-containing layer;
forming a thermal conductive layer on the surface of the transitional salicide layer; and
performing a second RTP on the transitional salicide layer, wherein the temperature of the second RTP is comprised between 350° C.~700° C.

2. The method of claim 1, further comprising forming a cap layer on the metal-atom-containing layer.

3. The method of claim 1, further comprising removing the thermal conductive layer after the second RTP is performed.

4. The method of claim 1, further comprising at least one gate structure and at least one source/drain region on the substrate, wherein the specific region comprises the surface of the gate structure or the surface of the source/drain region.

5. The method of claim 4, wherein the gate structure comprises a silicon-containing gate or a metal gate.

6. The method of claim 5, further comprising forming a dielectric hard mask disposed on the silicon-containing gate.

7. The method of claim 5, further comprising forming a plurality of contact holes on the silicon-containing gate and on the source/drain region.

8. The method of claim 7, wherein the salicide layer is formed in each contact hole.

9. The method of claim 1, wherein the specific region comprises a substrate surface that is not covered by a silicide block.

10. The method of claim 1, wherein the specific region comprises a region of the substrate that is surrounded by a shallow trench isolation (STI).

11. The method of claim 1, wherein the thermal conductive layer comprises titanium nitride (TiN), tantalum nitride (TaN) or tungsten nitride (WN).

12. The method of claim 2, wherein the cap layer comprises titanium nitride (TiN), tantalum nitride (TaN) or tungsten nitride (WN).

13. The method of claim 1, further comprising forming a contact structure on the salicide layer or on the thermal conductive layer.

* * * * *